US008278186B2

(12) United States Patent
Cha et al.

(10) Patent No.: US 8,278,186 B2
(45) Date of Patent: Oct. 2, 2012

(54) WAFER CLEANING METHOD AND WAFER BONDING METHOD USING THE SAME

(75) Inventors: Yong Won Cha, Seoul (KR); Dong Chul Kim, Gyeonggi-do (KR)

(73) Assignee: Ltrin Co., Ltd., Gyeonggi-do (KR)

( * ) Notice: Subject to any disclaimer, the term of this patent is extended or adjusted under 35 U.S.C. 154(b) by 139 days.

(21) Appl. No.: 12/602,285

(22) PCT Filed: Oct. 31, 2007

(86) PCT No.: PCT/KR2007/005446
§ 371 (c)(1),
(2), (4) Date: May 27, 2010

(87) PCT Pub. No.: WO2008/146994
PCT Pub. Date: Dec. 4, 2008

(65) Prior Publication Data
US 2010/0261332 A1    Oct. 14, 2010

(30) Foreign Application Priority Data

Jun. 1, 2007 (KR) .......................... 10-2007-0053932
Sep. 21, 2007 (KR) .......................... 10-2007-0097037
Sep. 21, 2007 (KR) .......................... 10-2007-0097038

(51) Int. Cl.
*H01L 21/30* (2006.01)

(52) U.S. Cl. ............ 438/455; 134/1.1; 134/1.2; 134/1.3; 134/30; 134/36; 134/153; 134/902; 257/E21.089; 257/E21.224; 257/E21.228; 257/E21.229; 438/456; 438/457; 438/458; 438/459; 438/460; 438/461; 438/462; 438/463; 438/464; 438/465; 438/906

(58) Field of Classification Search .................. None
See application file for complete search history.

(56) References Cited

U.S. PATENT DOCUMENTS 5,529,631 A    6/1996  Yoshikawa et al.
(Continued)

FOREIGN PATENT DOCUMENTS

JP          09167757 A       6/1997
(Continued)

*Primary Examiner* — Charles Garber
*Assistant Examiner* — Yasser Abdelaziez
(74) *Attorney, Agent, or Firm* — Alston & Bird LLP

(57) ABSTRACT

The present invention relates to a wafer cleaning and a wafer bonding method using the same that can improve a yield of cleaning process and bonding property in bonding the cleaned wafer by cleaning the wafer using atmospheric pressure plasma and cleaning solution. The wafer cleaning method includes the steps of providing a process chamber with a wafer whose bonding surface faces upward, cleaning and surface-treating the bonding surface of the wafer by supplying atmospheric pressure plasma and a cleaning solution to the bonding surface of the wafer, and withdrawing out the wafer from the process chamber. The wafer bonding method includes the steps of: providing a first process chamber with a first wafer whose bonding surface faces upward; cleaning and surface-treating the bonding surface of the first wafer by supplying atmospheric pressure plasma and a cleaning solution to the bonding surface of the first wafer; withdrawing out the first wafer from the first process chamber and providing a second process chamber with the first wafer; providing a third process chamber with a second wafer whose bonding surface faces upward; cleaning and surface-treating the bonding surface of the second wafer by supplying atmospheric pressure plasma and a cleaning solution to the bonding surface of the second wafer; withdrawing out the second wafer from the third process chamber and providing the second process chamber with the second wafer whose bonding surface faces to the bonding surface of the first wafer and bonding the bonding surfaces of the first and second wafers to each other.

17 Claims, 8 Drawing Sheets

U.S. PATENT DOCUMENTS

| | | | |
|---|---|---|---|
| 6,006,763 A * | 12/1999 | Mori et al. | 134/1.1 |
| 2002/0134403 A1* | 9/2002 | Selwyn et al. | 134/1.2 |
| 2004/0045578 A1* | 3/2004 | Jackson | 134/1.2 |
| 2006/0286783 A1* | 12/2006 | Papanu et al. | 438/510 |

FOREIGN PATENT DOCUMENTS

| | | |
|---|---|---|
| JP | 09-275085 | 10/1997 |
| JP | 11-345797 | 12/1999 |
| KR | 1020030004527 | 1/2003 |

* cited by examiner

WAFER CLEANING METHOD AND WAFER BONDING METHOD USING THE SAME

TECHNICAL FIELD

The present invention relates to a wafer cleaning method that can improve a yield of cleaning process and bonding property in bonding the cleaned wafer by using atmospheric pressure plasma and cleaning solution.

In addition, the present invention relates to a wafer bonding method that can improve a process yield and bonding property by surface-treating the wafer while cleaning the wafer by using atmospheric pressure plasma and cleaning solution.

BACKGROUND ART

Generally, a direct bonding method for wafers is known as a high integration method for a semiconductor device. In the direct bonding method, wafers are directly bonded to each other by using organ/inorganic adhesives or without using the adhesives in a method of manufacturing a SOI (Silicon On Insulator) or forming P-N junction by combining a P type wafer with a N type wafer.

In the method using organic/inorganic adhesives, the wafers can be bonded at a low temperature, but the method is not widely used because of interfacial stress and thermally or chemically unstable adhesive layer.

In addition, in the wafer bonding method, cleaning and surface treatment are performed to reduce bonding defects before bonding the wafer. However, because the cleaning and the surface treatment are separately performed, there is a problem that the process yield is reduced.

In the U.S. Pat. No. 4,939,101, there is disclosed a method that wafers are contacted with each other and then directly bonded to each other by heating them at a temperature higher than 1,100° C. under a pressure of about 1,000 to 15,000 psi. However, there are problems that the temperature is too high and thus, the method can be used when the bonded material cannot endure the temperature, and thermal mismatching is caused when the bonded materials are different from each other.

On the other hand, in the wafer bonding method, generally, planarization process of wafer surface is performed for reducing bonding defects before bonding the wafers. A chemical mechanical polishing (CMP) is usually used as the planarization method. For performing the CMP process, polishing is performed in a separate CMP process device and then the wafer bonding process is performed and thus, the processes should be separately performed. Accordingly, the process efficiency is reduced and a pollution problem is caused by slurry used in the CMP process. In addition, surface steps remain even after completion of polishing, thereby causing bonding defects in bonding of the final wafer.

DISCLOSURE OF THE INVENTION

Technical Problem

Accordingly, an object of the present invention is to provide a wafer cleaning method that can improve a yield of cleaning process and bonding property in bonding the cleaned wafer by surface-treating the wafer while cleaning the wafer by using atmospheric pressure plasma and cleaning solution in a single process.

Another object of the present invention is to provide a wafer bonding method that can improve a process yield and bonding property by surface-treating the wafer while cleaning the wafer by using atmospheric pressure plasma and cleaning solution in a single process.

A still another object of the present invention is to provide a wafer bonding method that can perform planarization process and wafer bonding process in situ.

Additional advantages, objects and features of the invention will be set forth in part in the description which follows and in part will become apparent to those having ordinary skill in the art upon examination of the following or may be learned from practice of the invention.

Technical Solution

According to an aspect of the present invention, there is provided a wafer cleaning method, which includes: (a) providing a process chamber with a wafer whose bonding surface faces upward; (b) cleaning and surface-treating the bonding surface of the wafer by supplying atmospheric pressure plasma and a cleaning solution to the bonding surface of the wafer; and (c) withdrawing out the wafer from the process chamber. In this time, the process chamber may be formed so as to supply the atmospheric pressure plasma and cleaning solution simultaneously. In addition, an activated gas for the atmospheric pressure plasma may be formed of any one selected from a group consisting of nitrogen, oxygen, argon (Ar) and helium (He), or mixture thereof. The cleaning solution may be formed of a deionized water or a $H_2O_2$—$NH_4OH$—$H_2O$(SC-1) solution.

In addition, the atmospheric pressure plasma and cleaning solution may be supplied simultaneously or sequentially. The cleaning solution may be supplied in vaporized particles by heating or ultrasonic wave. Or, the cleaning solution may be supplied in particles by nozzle spray.

In the step (b), the atmospheric pressure plasma and cleaning solution may be supplied to the wafer while the wafer is rotated. In addition, in the step (b), the atmospheric pressure plasma and cleaning solution may be sequentially supplied from one side of the wafer to the other side.

The wafer cleaning method may further include (d) drying the wafer after the step (b). The step (d) may be performed by a spin drying method of drying the wafer by rotating it or a blowing drying method of drying the wafer by blowing inert gas to the bonding surface.

According to another aspect of the present invention, there is provided a wafer bonding method, which includes: (a') providing a first process chamber with a first wafer whose bonding surface faces upward; (b') cleaning and surface-treating the bonding surface of the first wafer by supplying atmospheric pressure plasma and a cleaning solution to the bonding surface of the first wafer; (c') withdrawing out the first wafer from the first process chamber and providing a second process chamber with the first wafer; (d') providing a third process chamber with a second wafer whose bonding surface faces upward; (e') cleaning and surface-treating the bonding surface of the second wafer by supplying atmospheric pressure plasma and a cleaning solution to the bonding surface of the second wafer; (f') withdrawing out the second wafer from the third process chamber and providing the second process chamber with the second wafer whose bonding surface faces to the bonding surface of the first wafer; and (g') bonding the bonding surfaces of the first and second wafers to each other.

The first and third process chambers may be formed so as to supply the atmospheric pressure plasma and cleaning solution simultaneously, and the second process chamber may be formed of a vacuum chamber. The first and third process chambers may be formed of the same process chamber.

In addition, an activated gas for forming the atmospheric pressure plasma may be formed of any one selected from a group consisting of nitrogen, oxygen, argon (Ar) and helium (He), or mixture thereof. The cleaning solution may be formed of a deionized water or a $H_2O_2$—$NH_4OH$—$H_2O$(SC-1) solution. In addition, the atmospheric pressure plasma and cleaning solution may be supplied simultaneously or sequentially.

The cleaning solution may be supplied in vaporized particles by heating or ultrasonic wave. Or, the cleaning solution may be supplied in particles by nozzle spray.

In the step of (b') or (e'), the atmospheric pressure plasma and cleaning solution may be supplied to the first or second wafer while the first or second wafer is rotated.

In addition, in the step of (b') or (e'), the atmospheric pressure plasma and cleaning solution may be sequentially supplied from one side of the first or second wafer to the other side. The wafer cleaning method may further include (h') drying the first or second wafer after the step (b') or (e'). The step (h') may be performed by a spin drying method of drying the first or second wafer by rotating it or a blowing drying method of drying the first or second wafer by blowing inert gas to the bonding surface of the first or second wafer.

According to a still another aspect of the present invention, there is provided a wafer bonding method, which includes: (a") coating a SOG layer on a bonding surface of a first wafer by supplying a SOG solution; (b") forming a SOG film on the bonding surface of the first wafer by planarizing the SOG layer by pressing it with a flat plate panel and curing the SOG layer; (c") providing a first process chamber with the first wafer having the SOG film formed thereon, the bonding surface of the first wafer facing upward; (d") cleaning and surface-treating the bonding surface of the first wafer by supplying atmospheric pressure plasma and a cleaning solution to the bonding surface of the first wafer; (e") withdrawing out the first wafer from the first process chamber and providing a second process chamber with the first wafer; (f") providing a third process chamber with a second wafer whose bonding surface faces upward; (g") cleaning and surface-treating the bonding surface of the second wafer by supplying atmospheric pressure plasma and a cleaning solution to the bonding surface of the second wafer; (h") withdrawing out the second wafer from the third process chamber and providing the second process chamber with the second wafer whose bonding surface faces to the bonding surface of the first wafer; and (i") bonding the bonding surfaces of the first and second wafers to each other.

The SOG solution may be formed of silicate group or siloxane group materials. The flat plate panel may be formed of any one selected from a group consisting of polyether ether ketone (PEEK), polyether imide (PEI), polycarbonate (PC), polybutilene terephthalate (PBT) and mono cast nylon.

In addition, the flat plate panel is formed of transparent panel. In the step (b"), the SOG film may be formed by curing the SOG layer by irradiating UV ray to the SOG layer pressed with the transparent panel.

In addition, the steps (a") to (i") may be performed in situ.

Advantageous Effect

The wafer cleaning method according to the present invention produces the following effects.

First, the surface treatment and cleaning of the wafer are performed while supplying the atmospheric pressure plasma and cleaning solution in a single process, thereby improving yields of the cleaning process.

Second, the surface treatment and cleaning of the wafer are performed in a single process, thereby improving productivity of wafer bonding and bonding property.

Third, in a wafer providing unit, the contact area between a semiconductor device and a susceptor is relatively narrow at the inside part. Accordingly, amount of heat transferred to the inside of the semiconductor becomes smaller than that transferred to the outside and thus the whole of the semiconductor device is uniformly pre-heated, thereby preventing the semiconductor from being deformed by local temperature difference.

The wafer bonding method according to the present invention produces the following effects.

First, the surface treatment and cleaning of the wafer are performed while supplying the atmospheric pressure plasma and cleaning solution in a single process, thereby improving bonding property.

Second, the surface treatment and cleaning of the wafer are performed in a single process, thereby improving yields of the process, productivity and bonding property.

Third, the wafer planarizing process and wafer bonding process are performed in situ and thus pollution of the surface of the wafer is prevented, thereby improving bonding property.

DESCRIPTION OF THE DRAWINGS

The above and other objects, features and advantages of the present invention will be more apparent from the following detailed description taken in conjunction with the accompanying drawing, in which.

BEST MODE

Figure 1:
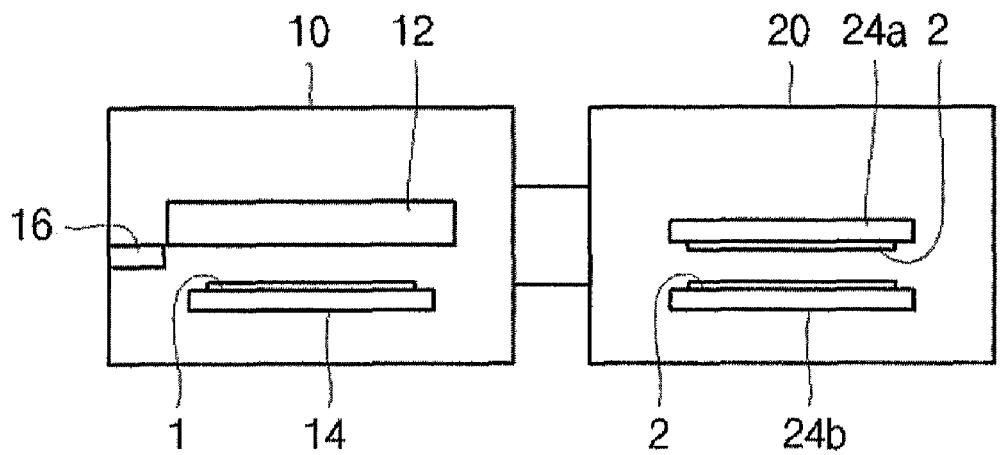
FIG. 1 is a schematic diagram illustrating a system for a wafer cleaning method according to an exemplary embodiment of the present invention.

Hereinafter, preferred embodiments of the present invention will be described in detail with reference to the accompanying drawing. The aspects and features of the present invention and methods for achieving the aspects and features will be apparent by referring to the embodiments to be described in detail with reference to the accompanying drawings. However, the present invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the present invention is only defined within the scope of the appended claims. In the entire description of the present invention, the same drawing reference numerals are used for the same elements across various figures.

First, a system for wafer cleaning method according to one embodiment of the present invention will be described.

FIG. 1 is a schematic diagram illustrating a system for a wafer cleaning method according to an exemplary embodiment of the present invention.

Referring to FIG. 1, the system for the wafer cleaning method includes a process chamber 10. In addition, the system for the wafer cleaning method may further include a vacuum chamber 20.

The process chamber 10 is a chamber for cleaning and surface-treating a surface of a wafer provided in the process chamber 10. The process chamber 10 is formed so as to simultaneously supply atmospheric pressure plasma and cleaning solution to the surface of the wafer. That is, the process chamber 10 includes both of a atmospheric pressure plasma forming device and a cleaning solution supply device 12. Further, the process chamber 10 includes a vacuum chuck 14 for fixing the wafer 1. In addition, the process chamber 10 may further include a drying unit 16 for drying the cleaned wafer.

The vacuum chamber 20 is a chamber for bonding the wafer 2 provided after cleaning and surface-treatment. The vacuum chamber 20 can form a vacuum state and may further include a heater. Further, the vacuum chamber 20 includes a vacuum chuck 24a, 24b for fixing the wafer 2. In addition, a system for only the wafer cleaning method may not include the vacuum chamber 20.

Figure 2:
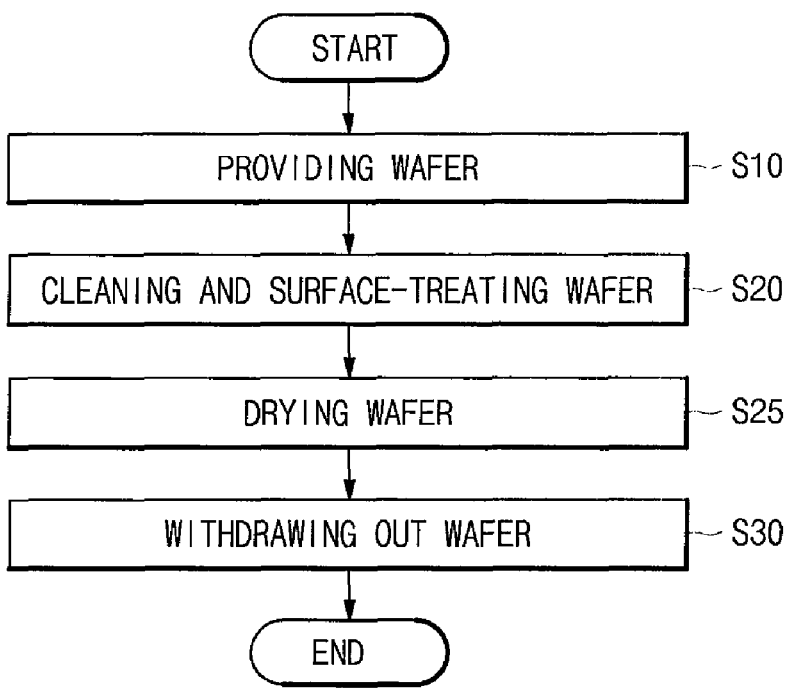
FIG. 2 is a flow chart illustrating the wafer cleaning method.

FIG. 2 shows a flow chart illustrating the wafer cleaning method.

Referring to FIG. 2, the wafer cleaning method includes providing a wafer (S10), cleaning and surface-treating the wafer (S20) and withdrawing out the wafer (S30). In addition, the wafer cleaning method may further include a step of drying the wafer (S25) after the step S20.

The wafer cleaning method may be used in a bonding process for bonding the wafer and applied to the cleaning and surface-treating process performed before the wafer bonding process.

According to the wafer cleaning method, the surface of the wafer is surface-treated while cleaning it in a single process, thereby improving a yield of the cleaning and surface-treating process. In other words, the surface of the wafer is surface-treated while cleaning it by supplying the atmospheric pressure plasma and cleaning solution simultaneously or sequentially on the surface of the wafer in one process chamber. Thus, efficiency and productivity of the wafer cleaning process are improved.

In addition, the wafer cleaning method can be performed in one process chamber provided in one system. That is, the step of wafer cleaning and surface-treating is performed in one process chamber and accordingly the cleaning process is more efficiently performed, thereby improving productivity. Further, the wafer cleaning and surface-treatment are performed in one process chamber and thus, additional pollution is prevented, thereby improving quality of the wafer cleaning and surface-treatment.

In the step S10, the process chamber is provided with a wafer whose bonding surface faces upward. Here, the bonding surface of the wafer means one surface of both surfaces of the wafer, the surface being bonded to other wafer. The process chamber is provided with the wafer for bonding and seated with the wafer, and supplied with the atmospheric pressure plasma and cleaning solution together. The wafer is provided in the process chamber so that the bonding surface faces upward, and fixed by an electrostatic chuck or a vacuum chuck. The bonding surface of the wafer may be a state that a silicon oxide film is formed on single crystal silicon in a predetermined thickness. Or, the bonding surface of the wafer may be a state that a native oxide film of $SiO_2$ is formed on single crystal silicon.

In the step S20, the bonding surface of the wafer is cleaned and surface-treated by supplying the atmospheric pressure plasma and cleaning solution to the bonding surface of the wafer. As described above, the process chamber can supply the atmospheric pressure plasma and cleaning solution simultaneously. When the wafer is provided and seated in the process chamber, the process chamber supplies the atmospheric pressure plasma and cleaning solution to the bonding surface of the wafer, thereby removing pollutants such as organic materials and fingerprints existing on the surface of the wafer by the cleaning solution. The bonding surface of the wafer is surface-treated while being cleaned by the atmospheric pressure plasma.

Si—O bonds of the silicon oxide film existing on the bonding surface of the wafer are broken by the atmospheric pressure plasma, and thus Si groups are exposed on the bonding surface of the wafer. In addition, $H_2O$ bonds existing in the cleaning solution are broken by the atmospheric pressure plasma and thus O—H groups are released. Accordingly, the Si group existing on the surface of the wafer keeps a state of being bonded to the O—H group.

The atmospheric pressure plasma and cleaning solution may be simultaneously or sequentially supplied. More particularly, the atmospheric pressure plasma and cleaning solution may be simultaneously supplied to the bonding surface of the wafer. Or, the atmospheric pressure plasma and cleaning solution may be alternatively supplied. In other words, the cleaning solution is firstly supplied to the bonding surface of the wafer, and then the atmospheric pressure plasma is supplied to the wafer. In addition, each of the cleaning solution and atmospheric pressure plasma may be alternatively supplied more than two times.

In the step S20, the atmospheric pressure plasma and cleaning solution are supplied in a single process performed in the process chamber and thus cleaning and surface-treating process can be more efficiently performed. In addition, the wafer is surface-treated simultaneously with cleaning by the cleaning solution, and thus the cleaning and surface-treating can be more efficiently performed. Further, a process time can be controlled according to a state of pollution of the wafer, thereby improving productivity.

A gas for forming the atmospheric pressure plasma may be formed of any one selected from a group consisting of nitrogen, oxygen, argon (Ar) and helium (He), or mixture thereof, but not limited thereto. Various gases capable of forming the atmospheric pressure plasma may be used.

A deionized water or a $H_2O_2$—$NH_4OH$—$H_2O$(SC-1) solution may be used as the cleaning solution. The cleaning solution removes pollutants such as organic materials, dusts, etc. existing on the bonding surface of the wafer. The cleaning solution cleans the bonding surface of the wafer together with the atmospheric pressure plasma, and thus the surface of the wafer is more efficiently cleaned. On the other hand, the cleaning solution supplies O—H ions bonded to Si ions existing on the bonding surface of the wafer. Various cleaning solutions available in a semiconductor process may be used as the cleaning solution.

The cleaning solution may be supplied in vaporized particles by heating or ultrasonic wave. Or, the cleaning solution may be supplied in particles by nozzle spray. The cleaning solution is supplied to the bonding surface of the wafer in particles such as vapors or mists, and thus it can be more uniformly supplied to the bonding surface of the wafer. In addition, the cleaning solution is uniformly supplied in particles on the whole, and thus does not affect formation of the atmospheric pressure plasma.

In the step S20, the cleaning solution and atmospheric pressure plasma may be supplied sequentially from one side of the wafer to the other side. In other words, a unit supplying the cleaning solution and atmospheric pressure plasma may scan from one side of the wafer to the other side and supply the cleaning solution and atmospheric pressure plasma. Accordingly, the cleaning solution and atmospheric pressure plasma are uniformly supplied to the wafer, and thus cleaning and surface-treating can be uniformly performed on the whole.

In the step S25, the cleaning solution existing on the bonding surface of the wafer is removed and the bonding surface of the wafer is dried. The cleaning solution supplied for bonding with other wafer remains on the bonding surface of the wafer. Accordingly, the cleaning solution on the bonding surface of the wafer should be removed for bonding with other wafer. On the other hand, the cleaning solution is removed while the wafer passes through annealing process after it is bonded. Therefore, the cleaning solution existing on the bonding surface of the wafer may be not completely removed. However, it is desirable to remove the cleaning solution because it disturbs bonding when a large amount of cleaning solution exists on the bonding surface of the wafer.

The step S25 may be performed by a spin drying method of drying the wafer by rotating it or a blowing drying method of drying the wafer by blowing an inert gas such as nitrogen to the bonding surface. The cleaning solution remained on the bonding surface of the wafer can be dried by the spin drying method or the blowing drying method because it may be not completely removed as described above.

In the step S30, the wafer is withdrawn out from the process chamber. As described above, the process chamber can supply the atmospheric pressure plasma and cleaning solution. The wafer withdrawn out from the process chamber is provided to a separate vacuum chamber for bonding with other wafer. The vacuum chamber is a chamber for bonding the wafer and is kept in vacuum. In addition, the vacuum chamber is provided with a separate heater so as to anneal the bonded wafer. The vacuum chamber may be included in the same system as the process chamber.

On the other hand, other wafer to be bonded with the wafer is provided to the process chamber and then cleaned and surface-treated. Accordingly, the wafer and other wafer can be sequentially provided to the vacuum chamber and bonded to each other. In addition, the wafer and other wafer without being cleaned and surface-treated may be sequentially provided to the vacuum chamber and then bonded to each other. Next, the wafer bonding method according to one embodiment of the present invention will be explained in more detail below. The wafer bonding method uses the wafer cleaning method as described above.

First, a system for the wafer bonding method will be schematically explained below.

Figure 3:
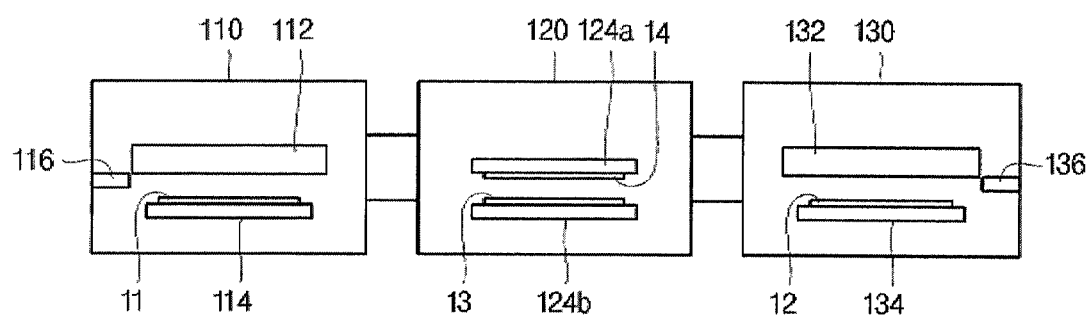
FIG. 3 is a schematic diagram illustrating a system for a wafer bonding method according to an exemplary embodiment of the present invention.

FIG. 3 is a schematic diagram illustrating the system for the wafer bonding method.

Referring to FIG. 3, the system for the wafer cleaning method includes a first process chamber 110, a second process chamber 120 and a third process chamber 130. The first and third process chambers 110 and 130 are chambers for cleaning and surface-treating the surface of provided wafer.

The first and third process chambers 110 and 130 are formed so as to simultaneously supply atmospheric pressure plasma and cleaning solution to the surfaces of the wafers 11 and 12. That is, the first and third process chambers 110 and 130 include both of a atmospheric pressure plasma forming device and a cleaning solution supply device 112, 132. Further, the first and third process chambers 110 and 130 include vacuum chucks 114 and 134 for fixing the wafers 11 and 12. On the other hand, the first and third process chambers may be formed in one chamber.

The second process chamber 120 is a chamber for bonding the wafers 13 and 14 provided after cleaning and surface-treatment. The second process chamber 120 can form a vacuum and may further include a heater. In addition, the second process chamber 120 includes vacuum chucks 124a and 124b fixing provided wafers 13 and 14.

Figure 4:
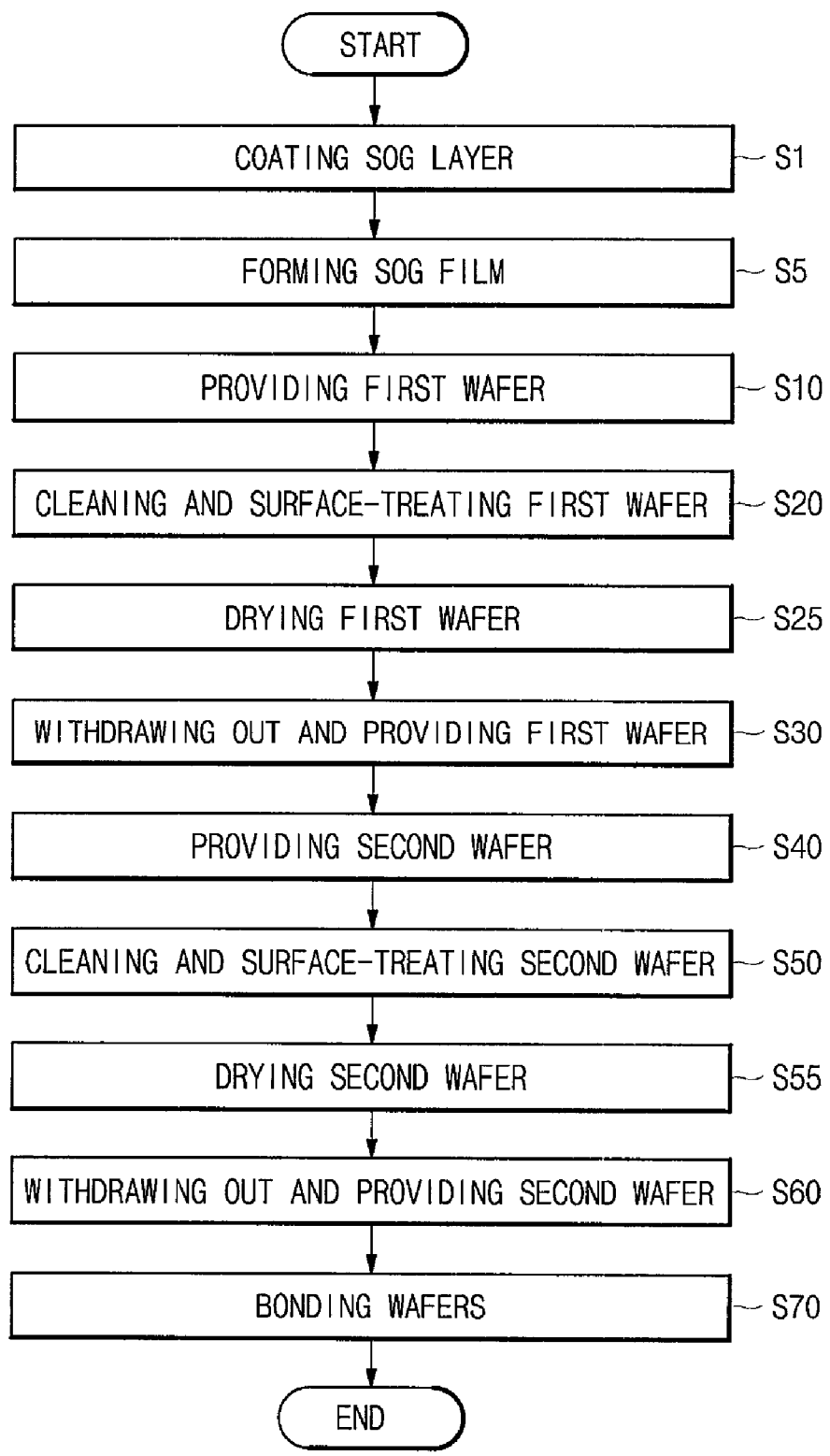
FIG. 4 is a flow chart illustrating the wafer bonding method.

FIG. 4 shows a flow chart illustrating the wafer cleaning method.

Referring to FIG. 4, the wafer cleaning method includes providing a first wafer (S110), cleaning and surface-treating the first wafer (S120), withdrawing out and providing the first wafer (S130), providing a second wafer (S140), cleaning and surface-treating the second wafer (S150), withdrawing out and providing the second wafer (S160) and bonding the wafer (S170). In addition, the wafer bonding method may further include a step of drying the second wafer (S155) after the step (S150).

According to the wafer bonding method, the surface of the wafer is surface-treated while cleaning it in a single process, thereby reducing bonding combination during the wafer bonding process. In other words, the surface of the wafer is surface-treated while cleaning it by supplying the atmospheric pressure plasma and cleaning solution simultaneously or sequentially on the surface of the wafer in one process chamber. Thus, efficiency and productivity of the wafer bonding process are improved.

In addition, the wafer bonding method may be performed in situ process in one system. That is, the steps S120, S150 and S170 may be respectively performed in separate process chambers included in one system. In the in situ process, all processes for wafer bonding are performed in one system, and thus the process is more efficiently performed, thereby improving productivity. Further, the in situ process prevents the surface of the wafer from being additionally polluted, thereby minimizing bonding defects of the wafer.

In the step S110, a first process chamber is provided with a first wafer whose bonding surface faces upward. Here, the bonding surface of the first wafer means one surface of both surfaces of the wafer, the surface being bonded to other wafer. The first process chamber is provided with the wafer for bonding and seated with the wafer, and supplied with the atmospheric pressure plasma and cleaning solution together. The first wafer is provided in the process chamber so that the bonding surface faces upward, and fixed by an electrostatic chuck or a vacuum chuck. The bonding surface of the first wafer may be a state that a silicon oxide film is formed on single crystal silicon in a predetermined thickness. Or, the bonding surface of the first wafer may be a state that a native oxide film of $SiO_2$ is formed on single crystal silicon.

In the step S120, the bonding surface is cleaned and surface-treated by supplying the atmospheric pressure plasma and cleaning solution to the bonding surface of the first wafer. As described above, the first process chamber can supply the atmospheric pressure plasma and cleaning solution simultaneously. When the first wafer is provided and seated in the first process chamber, the first process chamber supplies the atmospheric pressure plasma and cleaning solution to the bonding surface of the first wafer, thereby removing pollutants such as organic materials and fingerprints existing on the surface of the first wafer by the cleaning solution.

The bonding surface of the first wafer is surface-treated while being cleaned by the atmospheric pressure plasma. Si—O bonds of the silicon oxide film existing on the bonding surface of the first wafer are broken by the atmospheric pressure plasma, and thus Si groups are exposed on the bonding surface of the first wafer. In addition, $H_2O$ bonds existing in the cleaning solution are broken by the atmospheric pressure plasma and thus O—H groups are released. Accordingly, the Si group existing on the surface of the wafer keeps a state of being bonded to the O—H group.

The atmospheric pressure plasma and cleaning solution may be simultaneously or sequentially supplied. More particularly, the atmospheric pressure plasma and cleaning solution may be simultaneously supplied to the bonding surface of the first wafer. Or, the atmospheric pressure plasma and cleaning solution may be alternatively supplied. In other words, the cleaning solution is firstly supplied to the bonding surface of the first wafer, and then the atmospheric pressure plasma is supplied to the first wafer. In addition, each of the cleaning solution and atmospheric pressure plasma may be alternatively supplied more than two times.

In the step S120, the atmospheric pressure plasma and cleaning solution are supplied in a single process performed in the first process chamber and thus cleaning and surface-treating process can be more efficiently performed. In addition, the first wafer is surface-treated simultaneously with cleaning by the cleaning solution, and thus the cleaning and surface-treating can be more efficiently performed. Further, a process time can be controlled according to a state of pollution of the first wafer, thereby improving productivity.

A gas for forming the atmospheric pressure plasma may be formed of any one selected from a group consisting of nitrogen, oxygen, argon (Ar) and helium (He), or mixture thereof, but not limited thereto. Various gases capable of forming the atmospheric pressure plasma may be used.

A deionized water or a $H_2O_2$—$NH_4OH$—$H_2O(SC-1)$ solution may be used as the cleaning solution. The cleaning solution removes pollutants such as organic materials, dusts, etc. existing on the bonding surface of the first wafer. The cleaning solution cleans the bonding surface of the first wafer together with the atmospheric pressure plasma, and thus the surface of the first wafer is more efficiently cleaned. On the other hand, the cleaning solution supplies O—H ions bonded to Si ions existing on the bonding surface of the first surface. Various cleaning solutions available in a semiconductor process may be used as the cleaning solution.

The cleaning solution may be supplied in vaporized particles by heating or ultrasonic wave. Or, the cleaning solution may be supplied in particles by nozzle spray. The cleaning solution is supplied to the bonding surface of the first wafer in particles such as vapors or mists, and thus it can be more uniformly supplied to the bonding surface of the first wafer. In addition, the cleaning solution is uniformly supplied in particles on the whole, and thus does not affect formation of the atmospheric pressure plasma.

In the step S120, the cleaning solution may be supplied while rotating the first wafer. Accordingly, the cleaning solution and atmospheric pressure plasma are uniformly supplied to the first wafer, and thus cleaning and surface-treating can be uniformly performed on the whole.

In the step S120, the cleaning solution and atmospheric pressure plasma may be supplied sequentially from one side of the first wafer to the other side. In other words, a unit supplying the cleaning solution and atmospheric pressure plasma may scan from one side of the first wafer to the other side and supply the cleaning solution and atmospheric pressure plasma. Accordingly, the cleaning solution and atmospheric pressure plasma are uniformly supplied to the first wafer, and thus cleaning and surface-treating can be uniformly performed on the whole.

In the step S125, the cleaning solution existing on the bonding surface of the first wafer is removed and the bonding surface is dried. The cleaning solution supplied for bonding with other wafer remains on the bonding surface of the first wafer. Accordingly, the cleaning solution on the bonding surface of the first wafer should be removed for bonding with other wafer. On the other hand, the cleaning solution is removed while the first wafer passes through annealing process after it is bonded with a second wafer. Therefore, the cleaning solution existing on the bonding surface of the first wafer may be not completely removed. However, it is desirable to remove the cleaning solution because it disturbs bonding when a large amount of cleaning solution exists on the bonding surface of the first wafer.

The step S125 may be performed by a spin drying method of drying the first wafer by rotating it or a blowing drying method of drying the first wafer by blowing an inert gas such as nitrogen to the bonding surface of the first wafer. The cleaning solution remained on the bonding surface of the first wafer can be dried by the spin drying method or the blowing drying method because it may be not completely removed as described above.

In the step S130, the first wafer is withdrawn out from the first process chamber and provided to the second process chamber. As described above, the first process chamber can supply the atmospheric pressure plasma and cleaning solution. The second process chamber can form a vacuum. In addition, the second process chamber may include a heater for heating its inside according to a need. The first wafer is withdrawn out from the first process chamber after cleaning and surface-treating is completed, and provided to the second process chamber for bonding with other wafer. In this time, the first wafer may be provided so that its bonding surface faces upward.

In the step S140, the third process chamber is provided with the second wafer whose bonding surface faces upward. The step S140 is the same as the step S110 except that the second wafer is provided to the third process chamber, and therefore detailed explanation will be omitted.

The third process chamber can supply the atmospheric pressure plasma and cleaning solution together similar to the first process chamber. When the second wafer is cleaned and surface-treated in the third process chamber different from the first process chamber, a process time for wafer bonding can be reduced.

On the other hand, the step S140 may be performed in the first process chamber where the first wafer is cleaned and surface-treated. In other words, the third process chamber may be the same process chamber as the first process chamber. When the first and second wafers are cleaned and surface-treated in the same process chamber, the process timed may be relatively extended. However, a structure of the bonding device for wafer can be more simplified.

In the step S150, the bonding surface of the second wafer is cleaned and surface-treated by supplying the atmospheric pressure plasma and cleaning solution to the bonding surface of the second wafer. The step S150 is the same as the step S120 except that the second wafer is cleaned and surface-treated in the third process chamber, and therefore detailed explanation will be omitted.

In the step S155, the bonding surface of the second wafer is dried by removing the cleaning solution existing on the bonding surface of the second wafer.

The step S155 is the same as the step S125 except that the second wafer is dried in the third process chamber, and therefore detailed explanation will be omitted.

In the step S160, the second wafer is withdrawn out from the third process chamber and provided to the second process chamber so that the bonding surface of the second wafer faces upward. The step S160 is similar to the step S130, and therefore detailed explanation will be omitted. Merely, the bonding surface of the second wafer is provided so as to face to the bonding surface of the first wafer. In addition, the bonding surface of the second wafer is provided so as to be spaced from the bonding surface of the first wafer. The second and first wafers may be spaced from each other by a spacer plated arranged at the outside.

In the step S170, the bonding surfaces of the first and second wafers are bonded to each other in the second process chamber. The bonding surfaces of the first and second wafers are contacted to each other, and then pressurized by a predetermined pressure applied by a pressing unit located on them. Thus, the first and second wafers are bonded while being contacted to each other. In addition, the first and second wafers are contacted by pressing, and then completely bonded by completely removing the cleaning solution through annealing.

More particularly, when the bonding surfaces of the first and second wafers are bonded to each other by pressing, Si—O—H group existing on the bonding surface of the first wafer is bonded to Si—O—H group existing on the bonding surface of the second wafer. In this time, O—H groups existing on the bonding surface of the first wafer form Van der Waals bonds with O—H groups existing on the bonding surface of the second wafer. On the other hand, water ($H_2O$) exist between the bonding surfaces of the first and second wafers. The first and second wafers are completely bonded by Si—O—Si bond while $H_2O$ is released from bonds of S—O—H groups of the first and second wafers through annealing process. On the other hand, the water existing between the bonding surfaces of the first and second wafers is completely removed through the annealing process.

Next, a wafer bonding method according to another embodiment of the present invention will be explained below.

Figure 5:
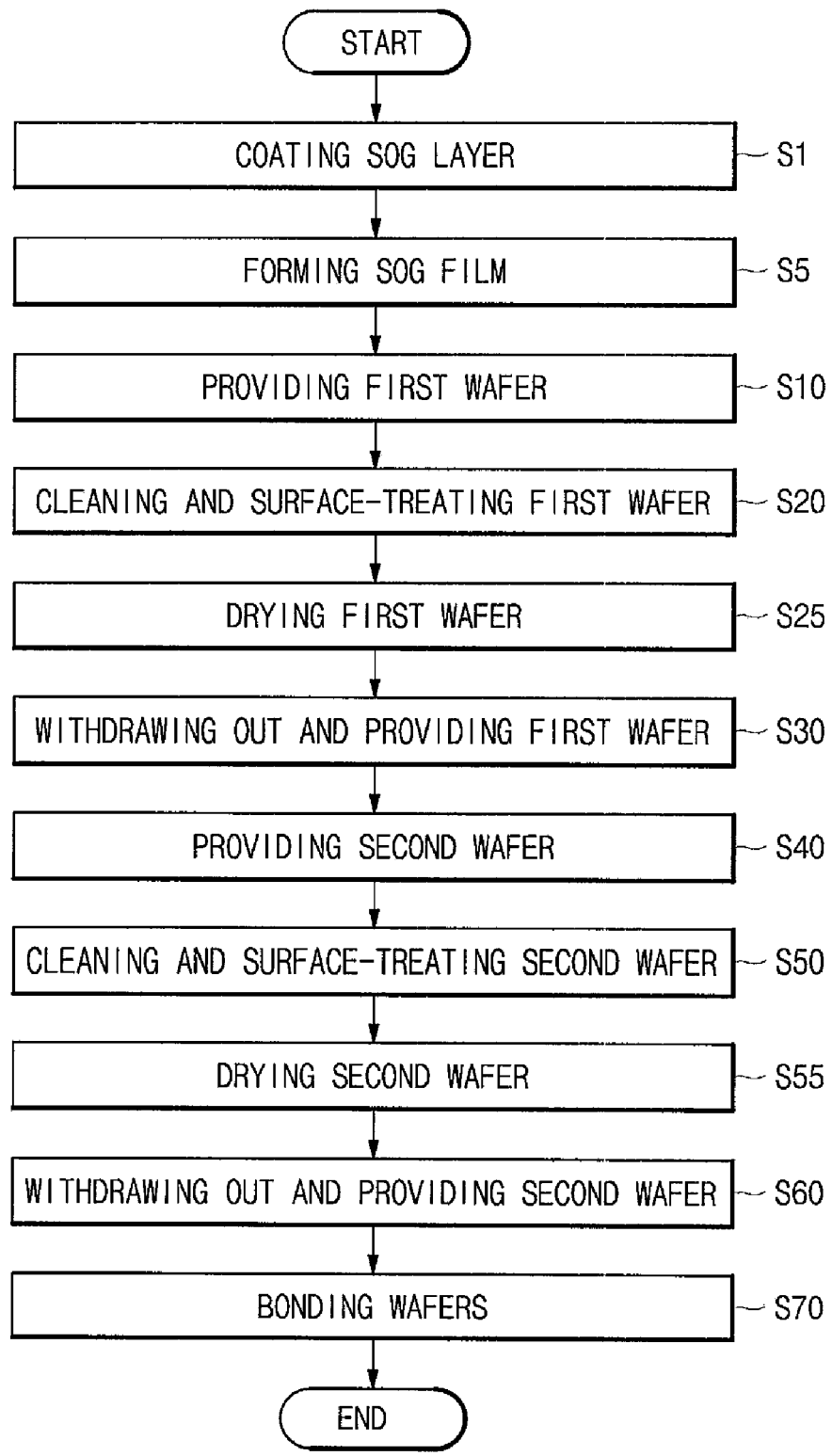
FIG. 5 is a flow chart illustrating a wafer bonding method according to another exemplary embodiment of the present invention.

Referring to FIG. 5, the wafer bonding method includes the steps of coating a SOG (spin on glass) layer (S11), forming a SOG film (S15), providing a first wafer (S110), cleaning and surface-treating the first wafer (S120), withdrawing out the first wafer and providing it (S130), providing a second wafer (S140), cleaning and surface-treating the second wafer (S150), withdrawing out the second wafer and providing it (S160) and bonding the wafers (S170). The wafer bonding method may further include a step S125 of drying the first wafer after the step S120. In addition, the wafer bonding method may further include a step S155 of drying the second wafer after the step S150.

The wafer bonding method further includes the steps S11 and S15 in comparison with the wafer bonding method shown in FIG. 4. That is, according to the wafer bonding method, the bonding surface of at least one wafer before the step S120 or S150 is planarized for improving the contact state of the bonding surface, thereby allowing the wafer to be strongly bonded.

In addition, the steps S11 and S15 may be performed for any one of the first and second wafers depending on the planarized state of the first and second wafers. In addition, the steps S11 and S15 may be performed for both of the first and second wafers. There will be explained about the case where the SOG film is formed on the first wafer below.

In the following explanation about the wafer bonding method, the same reference numerals for steps are used for the same or similar process as the wafer bonding method shown in FIG. 4, and detailed explanation will be omitted.

In the step S11, the bonding surface of the first wafer is coated with the SOG layer by supplying a SOG solution to it. The SOG solution is a liquid substance formed by melting glass in an organic solvent. For example, the SOG solution may be formed of a copolymer made by reacting silicate group or siloxane group dielectric material with a solvent such as toluene. The SOG layer has a photocurable property and is cured to a hard film by UV ray radiation. Various solutions generally used in a semiconductor process may be used as the SOG solution, but not limited thereto.

In the step S11, the bonding surface of the first wafer is coated with the SOG solution by the spin coating method, that is, by spraying the SOG solution on the bonding surface of the first wafer while rotating the first wafer whose bonding surface faces upward. In this time, the first wafer is rotated in a speed of 200 rpm to 500 rpm, and the rotation speed may be changed according to viscosity of the SOG solution. It is desirably that the SOG layer is formed in thickness of thousands of Å to tens of thousands of Å.

In the step S15, the SOG layer is planarized by pressing with a flat plate panel and cured, thereby forming the SOG film on the bonding surface of the first wafer. The surface of the SOG layer coated on the bonding surface of the first wafer may be uneven. Therefore, the SOG layer is planarized by pressing with the flat plate panel before it is cured. The flat plate panel may be formed of an engineering plastic material of high mechanical strength such as polyether ether ketone (PEEK), polyether imide (PEI), polycarbonate (PC), polybutilene terephthalate (PBT) or mono cast nylon materials. In addition, it is desirable that the flat plate panel is formed of a transparent material such as a polycarbonate resin that can transmit UV ray.

The SOG layer is planarized by pressing with the flat plate panel, and then cured by UV ray radiation, thereby forming the SOG film. The SOG layer may be cured by UV ray radiation after the flat plate panel is removed. In addition, when the flat plate panel is a transparent panel, the SOG layer may be cured by UV ray irradiated through the flat plate panel while the SOG layer is pressed by the flat plate panel. When the flat plate panel is a transparent panel, the SOG film can be formed in more planar. The surface of the first wafer provided with the SOG film becomes the bonding surface.

The steps S110, S120, S130, S140, S150, S160 and S170 have been detailedly explained in the description for the embodiment of FIG. 4, and therefore detailed explanation will be omitted.

On the other hand, the steps S11 to S170 may be performed in situ in one system. In other words, each of the steps S11, S120, S150 and S170 may be performed in a separate chamber provided in one system. In the in situ process, all processes for wafer bonding are performed in one system and thus the process is more efficiently performed, thereby improving productivity. In addition, the in situ process prevents the surface of the wafer from being additionally polluted during the wafer bonding process, thereby minimizing bonding defects of the wafer.

Next, examples of the wafer cleaning method and the wafer bonding method using the same and comparison examples will be explained, but not limited thereto.

MODE FOR INVENTION

Example 1

Figure 6:
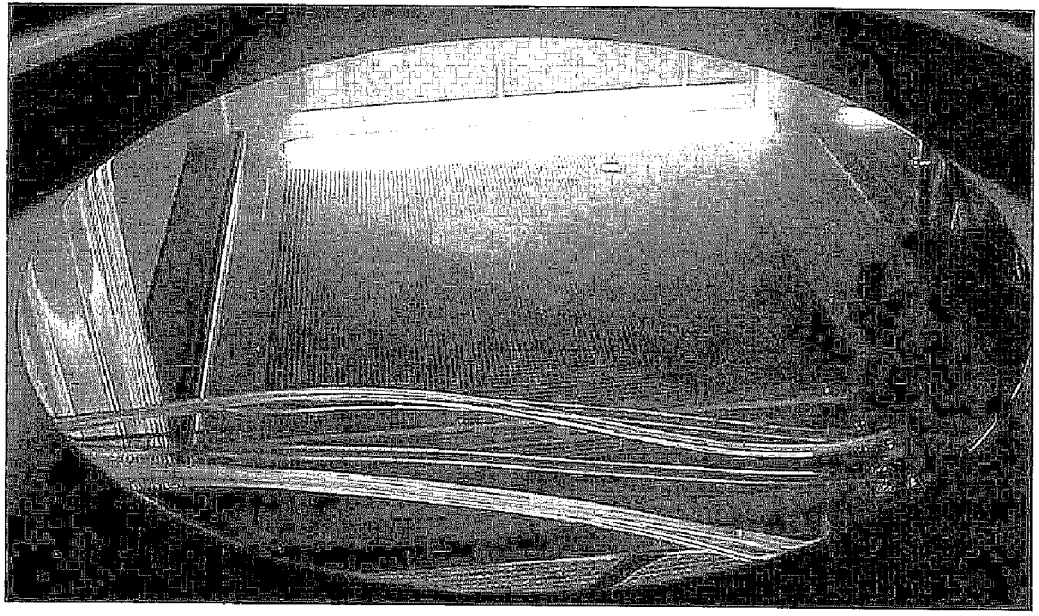
FIGS. 6 and 7 are views illustrating states of a bonding surface of wafer before and after the cleaning and surface treatment according to a first embodiment of the present invention respectively.
Figure 7:
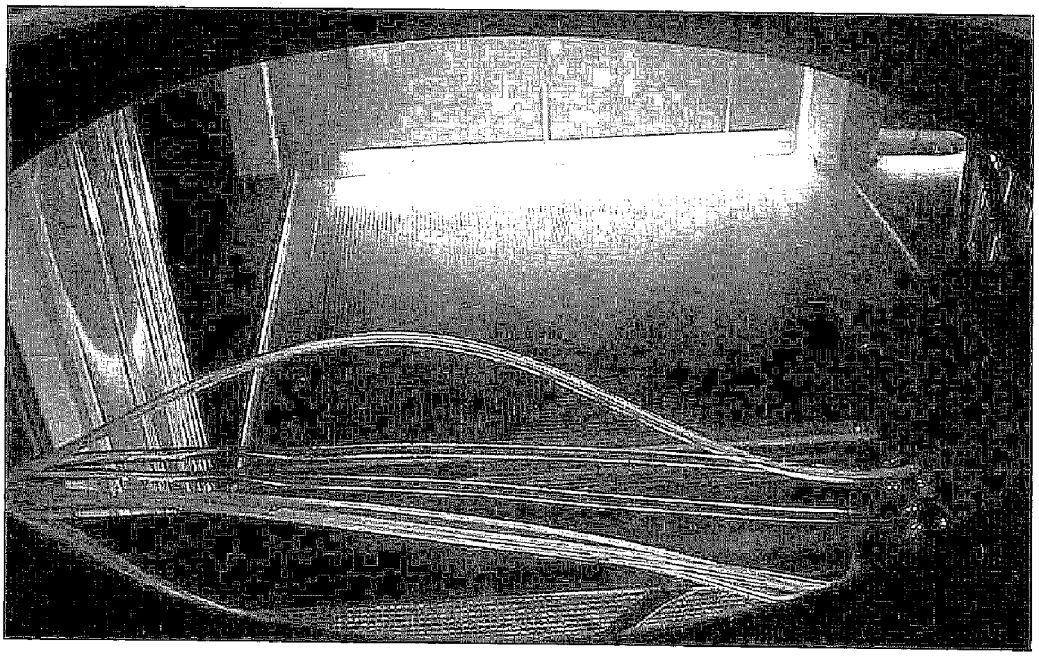

FIGS. 6 and 7 are photographs illustrating a wafer surface before and after cleaning and surface treatment according to the example 1.

First (RMA: about 1 nm) and second wafers of 8 inches were seated on a chuck of process chamber of an A type atmospheric pressure plasma device having power of 1,000 W. The first and second wafers may be planarized by CMP (Chemical Mechanical Polishing) process if it is needed. Fingerprints were arbitrarily formed on a bonding surface of the first wafer for evaluating cleanness of the wafer in the step of cleaning and surface-treating. The first and second wafers were cleaned and surface-treated by supplying atmospheric pressure plasma and water vapor together to the bonding surfaces of the wafers, where the atmospheric pressure plasma was formed by supplying nitrogen in 300 liter/min under atmospheric pressure, and the water vapor was formed by heating a deionized water. In this time, the atmospheric pressure plasma and water vapor were simultaneously supplied to the bonding surface of the wafer by a scan method. The water vapor was supplied in vaporized particles formed by heating the deionized water. In this time, the water vapor was supplied together with nitrogen, and the feed amount of the nitrogen was 5 liter/min. The bonding surfaces of the first and second wafers were dried by a spin drying process after the cleaning and surface-treatment was completed. Then, the first and second wafers were sequentially transferred to a vacuum chamber and aligned, then pressurized, bonded and annealed.

As shown in FIG. 6, fingerprints were formed on the bonding surface of the first wafer before the cleaning and surface-treatment. However, as shown in FIG. 7, fingerprints were removed from the bonding surface of the first wafer after the cleaning and surface-treatment. Accordingly, it was confirmed that the cleaning and surface-treatment was completely performed for the bonding surface of the first wafer in the step of cleaning and surface-treating. In addition, it was confirmed that the wafers bonded according to the example 1 had improved bonding states. That is, bonding strength between the first and second wafers bonded in the vacuum chamber was higher than 220 mJ/m$^2$. After annealing at a temperature of 300° C., the bonding strength of the bonded wafers was higher than 2300 mJ/m$^2$. Thus, it was confirmed that the first and second wafers bonded according to the example 1 had improved bonding strength.

Example 2

Figure 8:
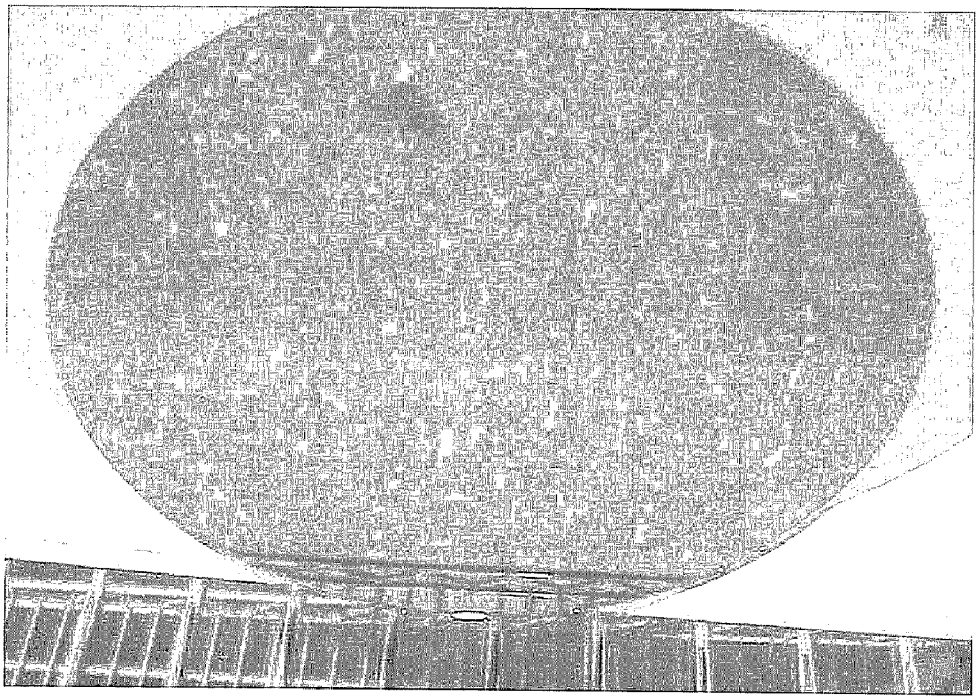
FIGS. 8 and 9 are views illustrating states of bonding surfaces of wafer before and after cleaning and surface treatment according to a second embodiment of the present invention respectively.
Figure 9:
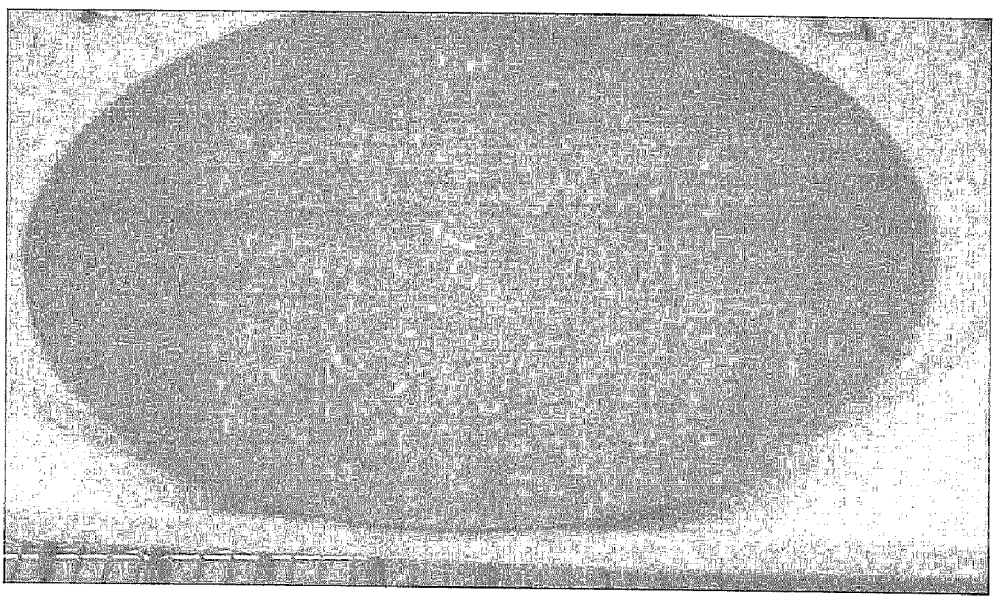

FIGS. 8 and 9 are photographs illustrating a wafer surface before and after cleaning and surface treatment according to the example 2.

In the example 2, all processes were performed the same as the example 1 except that the water vapor was supplied by a nozzle spray method.

As shown in FIG. 8, fingerprints existed on the surface of the first wafer before cleaning of the first wafer. However, as shown in FIG. 9, fingerprints were removed from the surface of the first wafer after the cleaning of the first wafer. Accordingly, it was confirmed that the cleaning and surface-treatment was completely performed for the bonding surface of the first wafer in the step of cleaning and surface-treating.

It was confirmed that the wafers bonded according to the example 2 kept an improved bonding state. That is, the bonding strength of the wafers before annealing was higher than 220 mJ/m$^2$. After annealing at a temperature of 300° C., the bonding strength of the bonded wafers was higher than 2300 mJ/m$^2$. Thus, it was confirmed that the first and second wafers bonded according to the example 2 had improved bonding strength.

Example 3

A bonding surface of a first wafer of 3 inches was coated with a SOG solution by spin coating so as to form a SOG layer. Next, the SOG layer was planarized by pressing its upper part with a transparent panel and photocured by irradiating UV ray to the upper part of the transparent panel, thereby forming a SOG film. Then, the first and second wafers were cleaned and surface-treated, and bonded to each other through the same processes as the example 1.

It was also confirmed that the cleaning and surface-treatment was completely performed for the bonding surface of the first wafer in the step of cleaning and surface-treating like the example 1. Thus, it was confirmed that the first and second wafers bonded according to the example 3 had improved bonding strength.

Comparison Example 1

Figure 10:
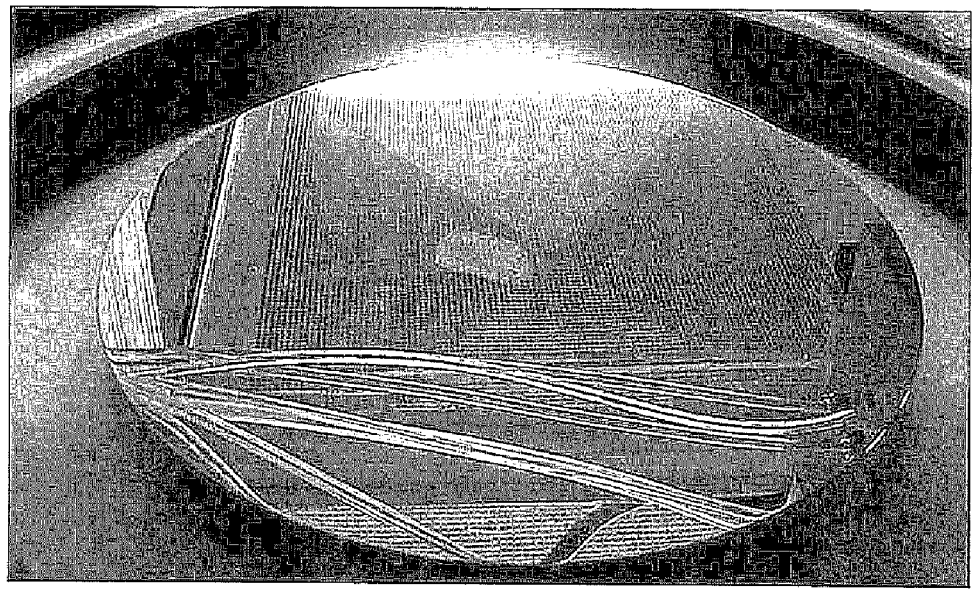
FIGS. 10 and 11 are views illustrating states of bonding surfaces of wafer before and after cleaning and surface treatment according to a first comparison example of the present invention respectively.
Figure 11:
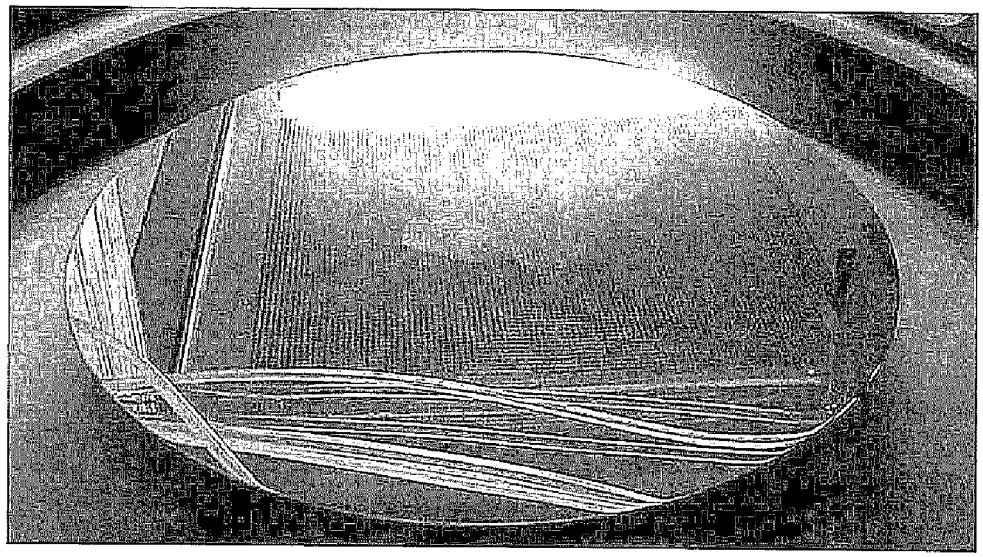

FIGS. 10 and 11 are photographs illustrating a wafer surface before and after cleaning and surface treatment according to the comparison example 1.

First (RMA: about 1 nm) and second wafers of 8 inches were seated on a chuck of process chamber of an A type atmospheric pressure plasma device having power of 1,000 W. The first and second wafers may be planarized by CMP (Chemical Mechanical Polishing) process if it is needed. Fingerprints were arbitrarily formed on a bonding surface of the first wafer for evaluating cleanness of the wafer in the step of cleaning and surface-treating according to the comparison example 1. The first and second wafers were cleaned and surface-treated by supplying atmospheric pressure plasma to the bonding surfaces of the wafers, where the atmospheric pressure plasma was formed by supplying nitrogen in 300 liter/min under atmospheric pressure. In this time, water vapor was not supplied, differently from the example 1. Then, the first and second wafers were sequentially transferred to a vacuum chamber and aligned, then pressurized, bonded and annealed.

As shown in FIG. 10, fingerprints were formed on the bonding surface of the first wafer before the cleaning and surface-treatment. Also, as shown in FIG. 11, fingerprints existed on the bonding surface of the first wafer even after the cleaning and surface-treatment was completed. Accordingly, it was confirmed that the cleaning and surface-treatment was not completely performed for the bonding surface of the first wafer in the step of cleaning and surface-treating according to the comparison example 1.

In addition, as a result that the first and second wafers processed according to the comparison example 1 were bonded to each other in a separate vacuum chamber, it was confirmed that the bonding was incomplete and the bonding strength was relatively weak.

Comparison Example 2

Figure 12:
FIG. 12 is a view illustrating a state of a bonding surface of wafer after cleaning according to a second comparison example.

FIG. 12 is a photograph illustrating a wafer surface after cleaning according to the comparison example 2.

First (RMA: about 1 nm) and second wafers of 8 inches were seated on a vacuum chuck of a process chamber. The first and second wafers may be planarized by CMP (Chemical Mechanical Polishing) process if it is needed. Fingerprints were arbitrarily formed on a bonding surface of the first wafer for evaluating cleanness of the wafer in the step of cleaning process according to the comparison example 2. The first and second wafers were cleaned by supplying water vapor formed by heating a deionized water to the bonding surfaces of the wafers. In this time, the atmospheric pressure plasma was not supplied, differently from the example 1. The water vapor was supplied together with nitrogen, and the feed amount of the nitrogen was 5 liter/min.

The bonding surfaces of the first and second wafers were dried by a spin drying process after the cleaning process was completed. Then, the first and second wafers were transferred to a separate process chamber, and sequentially surface-treated by atmospheric pressure plasma. In addition, the first and second wafers were transferred to a separate vacuum chamber and aligned, then pressurized, bonded and annealed.

As shown in FIG. 12, it was confirmed that fingerprints existed on the bonding surface of the first wafer even after the cleaning process was completed. Accordingly, it was confirmed that the cleaning was not completely performed for the bonding surface of the first wafer in the cleaning process according to the comparison example 2.

In addition, as a result that the first and second wafers processed according to the comparison example 2 were separately surface-treated by atmospheric pressure plasma, and then bonded to each other, it was confirmed that the bonding was incomplete and the bonding strength was relatively weak.

It should be understood by those of ordinary skill in the art that various replacements, modifications and changes in the form and details may be made therein without departing from the spirit and scope of the present invention as defined by the following claims. Therefore, it is to be appreciated that the above described embodiments are for purposes of illustration only and are not to be construed as limitations of the invention.

Industrial Applicability

The wafer cleaning method and wafer bonding method using the same can be utilized for improving a yield of cleaning process and bonding property of the semiconductor wafer.

The invention claimed is:

1. A wafer bonding method, which comprising:
   (a') providing a first process chamber with a first wafer whose bonding surface faces upward;
   (b') cleaning and surface-treating the bonding surface of the first wafer by supplying atmospheric pressure plasma and a cleaning solution to the bonding surface of the first wafer;
   (c') withdrawing out the first wafer from the first process chamber and providing a second process chamber with the first wafer;
   (d') providing a third process chamber with a second wafer whose bonding surface faces upward;
   (e') cleaning and surface-treating the bonding surface of the second wafer by supplying atmospheric pressure plasma and a cleaning solution to the bonding surface of the second wafer;
   (f') withdrawing out the second wafer from the third process chamber and providing the second process chamber with the second wafer whose bonding surface faces to the bonding surface of the first wafer; and
   (g') bonding the bonding surfaces of the first and second wafers to each other.

2. The wafer cleaning method of claim 1, wherein the first and third process chambers are formed so as to supply the atmospheric pressure plasma and cleaning solution simultaneously, and the second process chamber is a vacuum chamber.

3. The wafer cleaning method of claim 1, wherein the first and third process chambers are the same process chamber.

4. The wafer bonding method of claim 1, wherein an activated gas for the atmospheric pressure plasma is any one selected from a group consisting of nitrogen, oxygen, argon (Ar) and helium (He), or mixture thereof.

5. The wafer bonding method of claim 1, wherein the cleaning solution is a deionized water or a $H_2O_2$—$NH_4OH$—$H_2O$(SC-1) solution.

6. The wafer bonding method of claim 1, wherein the atmospheric pressure plasma and cleaning solution are supplied simultaneously or sequentially.

7. The wafer bonding method of claim 1, wherein the cleaning solution is supplied in vaporized particles by heating or ultrasonic wave.

8. The wafer bonding method of claim 1, wherein the cleaning solution is supplied in particles by nozzle spray.

9. The wafer bonding method of claim 1, wherein, in the step (b') or (e'), the atmospheric pressure plasma and cleaning solution are supplied to the first or second wafer while the first or second wafer is rotated.

10. The wafer bonding method of claim 1, wherein, in the step (b') or (e'), the atmospheric pressure plasma and cleaning solution are sequentially supplied from one side of the first or second wafer to the other side.

11. The wafer bonding method of claim 1, further comprising (h') drying the first or second wafer after the step (b') or (e').

12. The wafer bonding method of claim 11, wherein the step (h') is performed by a spin drying method of drying the first or second wafer by rotating it or a blowing drying method of drying the first or second wafer by blowing inert gas to the bonding surface of the first or second wafer.

13. A wafer bonding method, which comprising:
   (a'') coating a SOG layer on a bonding surface of a first wafer by supplying a SOG solution;
   (b'') forming a SOG film on the bonding surface of the first wafer by planarizing the SOG layer by pressing it with a flat plate panel and curing the SOG layer;
   (c'') providing a first process chamber with the first wafer having the SOG film formed thereon, the bonding surface of the first wafer facing upward;
   (d'') cleaning and surface-treating the bonding surface of the first wafer by supplying atmospheric pressure plasma and a cleaning solution to the bonding surface of the first wafer;
   (e'') withdrawing out the first wafer from the first process chamber and providing a second process chamber with the first wafer;
   (f'') providing a third process chamber with a second wafer whose bonding surface faces upward;

(g") cleaning and surface-treating the bonding surface of the second wafer by supplying atmospheric pressure plasma and a cleaning solution to the bonding surface of the second wafer;

(h") withdrawing out the second wafer from the third process chamber and providing the second process chamber with the second wafer whose bonding surface faces to the bonding surface of the first wafer; and (i") bonding the bonding surfaces of the first and second wafers to each other.

14. The wafer bonding method of claim 13, wherein the SOG solution is silicate group or siloxane group materials.

15. The wafer bonding method of claim 13, wherein the flat plate panel is be formed of any one selected from a group consisting of polyether ether ketone (PEEK), polyether imide (PEI), polycarbonate (PC), polybutilene terephthalate (PBT) and mono cast nylon.

16. The wafer bonding method of claim 13, wherein the flat plate panel is formed of transparent panel, and in the step (b"), the SOG film is formed by curing the SOG layer by irradiating UV ray to the SOG layer pressed with the transparent panel.

17. The wafer bonding method of claim 13, wherein the steps (a") to (i") are performed in situ.

* * * * *